United States Patent
Hu

(10) Patent No.: US 6,524,953 B1
(45) Date of Patent: Feb. 25, 2003

(54) ASYMMETRIC, DOUBLE-SIDED SELF-ALIGNED SILICIDE AND METHOD OF FORMING THE SAME

(75) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/328,537

(22) Filed: Jun. 9, 1999

Related U.S. Application Data

(62) Division of application No. 09/026,104, filed on Feb. 19, 1998, now Pat. No. 6,147,405.

(51) Int. Cl.[7] .............................................. H01L 21/44
(52) U.S. Cl. ..................... 438/655; 438/682; 438/649; 438/651
(58) Field of Search ................................ 438/650, 649, 438/651, 655, 660, 661, 682, 683

(56) References Cited

U.S. PATENT DOCUMENTS

| | | |
|---|---|---|
| 4,521,952 A | 6/1985 | Riseman |
| 4,605,947 A | 8/1986 | Price et al. |
| 4,994,402 A | 2/1991 | Chiu |
| 5,032,233 A | 7/1991 | Yu et al. |
| 5,043,300 A | 8/1991 | Nulman |
| 5,084,406 A | 1/1992 | Rhodes et al. |
| 5,094,977 A | 3/1992 | Yu et al. |
| 5,147,819 A | 9/1992 | Yu et al. |
| 5,187,122 A | 2/1993 | Bonis |
| 5,196,360 A | 3/1993 | Doan et al. |
| 5,236,865 A | 8/1993 | Sandhu et al. |
| 5,278,098 A | 1/1994 | Wei et al. |
| 5,341,016 A | 8/1994 | Prall et al. |
| 5,378,641 A | 1/1995 | Cheffings |
| 5,389,575 A | 2/1995 | Chin et al. |
| 5,480,814 A | 1/1996 | Wuu et al. |

(List continued on next page.)

FOREIGN PATENT DOCUMENTS

JP      60-10673 A      1/1985

OTHER PUBLICATIONS

Byun et al. "TiN/TiSi2 Formaton Using TiNx Layer and Its Feasibilities in ULSI", Jpn. J. Appl. Phys. vol. 34 (1995), pps 982–986.*

Jeong Soo Byun, Hak Nam Kim et al., "*Formation of a large grain sized TiN layer using $TiN_x$, the epitaxial continuity at the Al/TiN interface* . . . ", J. Appl. Phys. 78(3), Aug. 1, 1995, pps. 1719–1724.

Jeong Soo Byun, "*Epitaxial C49–$TiSi_2$ Formation on (100)Si Substrate Using $TiN_x$ and Its Electrical Characteristics as a Shallow Contact Metallization*", J. Electrochem. Soc., vol. 143, No. 6, Jun. 1996, pps. 1984–1991.

(List continued on next page.)

*Primary Examiner*—Kevin M. Picardat
(74) *Attorney, Agent, or Firm*—Knobbe, Martens, Olson & Bear, LLP

(57) ABSTRACT

Disclosed are structures and processes which are related to asymmetric, self-aligned silicidation in the fabrication of integrated circuits. A pre-anneal contact stack includes a silicon substrate, a metal source layer such as titanium-rich titanium nitride ($TiN_x$), and a silicon layer. The metal nitride layer is deposited on the substrate by sputtering a target metal reactively in nitrogen and argon ambient. A N:Ar ratio is selected to deposit a uniform distribution of the metal nitride in an unsaturated mode (x<1) over the silicon substrate. The intermediate substrate structure is sintered to form a metal silicide. The silicidation of metal asymmetrically consumes less of the underlying silicon than the overlying silicon layer. The resulting structure is a mixed metal silicide/nitride layer which has a sufficient thickness to provide low sheet resistance without excessively consuming the underlying substrate. A metal nitride of maximum bulk resistivity within the unsaturated (metal-rich) realm is chosen for maximizing asymmetry in the silicidation.

29 Claims, 10 Drawing Sheets

U.S. PATENT DOCUMENTS

| | | | |
|---|---|---|---|
| 5,508,212 | A | 4/1996 | Wang et al. |
| 5,656,519 | A | 8/1997 | Mogami |
| 5,656,546 | A | 8/1997 | Chen et al. |
| 5,756,394 | A | 5/1998 | Manning |
| 5,856,237 | A | 1/1999 | Ku |
| 5,888,903 | A | 3/1999 | O'Brien et al. |
| 5,945,350 | A * | 8/1999 | Violette et al. ............. 438/621 |

OTHER PUBLICATIONS

Jeong S. Byun, Kwan G. Rha et al., "*Epitaxial TiSi$_2$ Growth on Si(100) From Reactive Sputtered TiN$_x$ and Subsequent Annealing*", Materials Research Soc. Proceedings, vol. 355, Pittsburgh, 1995, pps. 465–470.

Yung–Song Lou, Ching–Yuan Wu, Huang–Chung Cheng, "*The Process Window of a–Si/Ti Bilayer Metallization for an Oxidation–Resistant and Self–Aligned TiSi2 Process,*" IEEE Transactions on Electron Devices, vol. 39, No. 8, Aug. 1992, pps. 1835–1843.

Jeong Soo Byun, Jun Ki Kim et al., "*W as a Bit Line Interconnection in Capacitor–Over–Bit–Line (COB) Structured Dynamic Random Access Memory (DRAM) and Feasible Diffusion Barrier Layer*", Jpn. J. Appl. Phys. vol. 35 (1996), pps. 1086–1089.

* cited by examiner

ASYMMETRIC, DOUBLE-SIDED SELF-ALIGNED SILICIDE AND METHOD OF FORMING THE SAME

REFERENCE TO RELATED APPLICATION

This is a divisional application of application Ser. No. 09/026,104, filed Feb. 19, 1998, now U.S. Pat. No. 6,147,405.

BACKGROUND OF THE INVENTION

1. Field of the Invention

The present invention relates to fabrication of semiconductor circuit devices. More particularly, the present invention is directed to self-aligned silicide structures and methods of forming the same without excessive consumption of underlying silicon.

2. Description of Related Art

As is well known in processing integrated circuits, electrical contacts must be made among circuit nodes, such as isolated device active regions formed within a single-crystal silicon substrate. As the contact dimensions of devices become smaller, the contact resistance and the sheet resistance of the contacts increase. In this regard, refractory metal silicides have been used for local interconnections to provide low resistance electrical contacts between device active regions within the silicon substrate.

One common method of forming metal silicides is a self-aligned silicide process, often referred to as salicidation. A thin layer of refractory metal, such as titanium, is deposited over a dielectric area and through contact openings formed on the dielectric area to contact underlying silicon circuit elements, such as source and drain active regions formed within a silicon substrate. The structure is generally annealed to form a silicide, such as titanium silicide (predominantly $TiSi_2$) at a high temperature. During the anneal, the deposited titanium reacts with the silicon in the contact to form $TiSi_2$ at the contact openings. Titanium which overlies the dielectric area does not form $TiSi_2$, as the titanium does not contact any silicon. The process is referred to as "self-aligned" because the silicide is formed only where the metal layer contacts silicon, for example, through the contact openings. After the first annealing, the unreacted titanium may be removed in a wet etch, and a post-silicidation anneal is performed to lower the sheet resistance of the silicide to acceptable levels. The final annealing converts titanium silicide from the C49 phase to the lower resistance C54 phase. This self-aligned silicide is often referred to by the short form "salicide."

In the salicidation process, silicon from the contact regions of the substrate diffuses upward into the titanium layer. Similarly, titanium diffuses into the underlying active areas of the silicon substrate. Titanium and silicon react with each other to form a silicide thick enough to provide low sheet resistance. As a result, the doped active area of the silicon substrate becomes thinner due to the consumption of silicon during the reaction. The resultant silicide is said to intrude or sink into the substrate. Over-consumption of the underlying silicon can be problematic for any silicon circuit element, tending to cause voids, and thus device failures. Where contact is made to a shallow junction active area of a silicon substrate, salicide contacts of sufficient thickness cannot be formed without completely destroying a junction.

A need, therefore, exists for an interconnect and method of fabricating the same, which provides the advantages of salicide interconnects without excessive consumption of underlying silicon to which contact is made.

SUMMARY OF THE INVENTION

The aforementioned needs are satisfied by several aspects of the present invention.

In accordance with one aspect of the present invention, a method is provided for forming a self-aligned silicide contact on a silicon substrate. The method includes forming a contact window through an insulating layer over the silicon substrate, thereby exposing a portion of the silicon substrate. A metal nitride layer is deposited over the exposed portion of the silicon substrate. A silicon layer is formed over the metal nitride layer.

In accordance with another aspect of the present invention, a method is provided for forming a metal source layer, which incorporates a uniform distribution of an impurity and a metal, between silicon structures in an integrated circuit. The method includes selecting a sputtering ambient to maximize bulk resistivity for a metal-rich class of layers incorporating the impurity and the metal. A metallic target is sputtered in the selected ambient.

In accordance with another aspect of the present invention, a method is provided for forming a silicide interconnect over a silicon substrate. The method includes selecting a metal layer incorporating an impurity to a level below saturation. The metal layer has a bulk resistivity within about 15% of the maximal resistivity for unsaturated metal layers having the same metal and impurity. The selected layer is deposited over the silicon substrate, and the selected layer and the substrate are sintered.

In accordance with another aspect of the present invention, a method is provided for forming a self-aligned silicide contact to a semiconductor substrate. The method includes opening a contact in an insulating layer to expose an active region of the substrate. A refractory metal source layer is deposited into the contact directly over the active region of the substrate. A silicon source layer is deposited directly over the refractory metal source layer. A silicidation is then performed to form the self-aligned silicide contact. The silicidation preferentially consumes silicon from the silicon source layer as compared to silicon from the substrate in a ratio of greater than about 1.2:1.

In accordance with another aspect of the present invention, an intermediate substrate assembly is provided. The assembly includes a silicon substrate, a metal nitride layer directly over the silicon substrate, and a silicon layer directly over the metal nitride layer. In accordance with a preferred embodiment, this intermediate assembly is sintered to form a silicide contact.

In accordance with another aspect of the present invention, an integrated circuit is provided, including a silicon substrate, an insulating layer formed over the silicon substrate with a contact opening formed in the insulating layer, and a conductive contact directly contacting the silicon substrate within the contact opening. The contact includes metal silicide uniformly interspersed with metal nitride.

In accordance with another aspect of the present invention, an integrated circuit includes a silicon substrate and a self-aligned contact. The contact includes a metal silicide, and the extends into the substrate below the upper surface of the substrate by an amount less than about 30% of the contact thickness.

In accordance with another aspect of the present invention, a self-aligned silicide contact is provided. The contact extends below a substrate surface into a shallow junction transistor active area, which has a junction depth of no more than about 1,000 Å. The contact extends below the substrate surface by no more than about 30% of the junction depth.

These and other features of the present invention will become more fully apparent from the following description and claims.

BRIEF DESCRIPTION OF THE DRAWINGS

FIGS. 1A and 1B respectively show silicon substrate subassemblies before annealing and after annealing.

FIGS. 2A and 2B, respectively, show silicon substrate assembly structures before annealing and after annealing.

FIG. 4 shows X-ray photoelectron spectroscopic ("XPS") profiles of integrated circuits constructed in accordance with the preferred embodiment.

DETAILED DESCRIPTION OF THE PREFERRED EMBODIMENT

While the preferred embodiments are illustrated in the context of self-aligned silicide (or "salicide") contacts to active regions in silicon substrates, it will be recognized by one of skill in the art of semiconductor fabrication that the invention will have application whenever electrical contact to silicon elements is desirable. For example, salicide can be used in forming contact to silicon interconnects, gate electrodes or plugs. Furthermore, the term "substrate," as used in the present application, refers to one or more semiconductor layers or structures which include active or operable portions of semiconductor devices.

In general, one method of reducing substrate (or "silicon electrical element") consumption in forming self-aligned silicide wiring is to supply additional silicon to the process. For example, an intermediate silicon layer can be introduced between the silicon substrate and the titanium layer. The intermediate silicon layer provides the titanium layer with some or all of the silicon required in the salicidation.

With intermediate silicon, however, the titanium layer should be thick enough to consume all of the intermediate silicon in order for the silicide to be in contact with the underlying active area of the silicon substrate. Alternatively, the intermediate silicon layer must be doped to match the doping type of the contacted active region in order to ensure ohmic contact, forming "raised" source/drain regions. Such doping can require an additional mask and all the attendant processing steps. In the fabrication of CMOS circuits, which utilize complementary n-channel and p-channel devices, contacts require two marks for doping the different regions which contact p+ drains and n+ drains, respectively. Each of these masks is expensive both to create for different chip designs and to use in production.

Figure 1A:
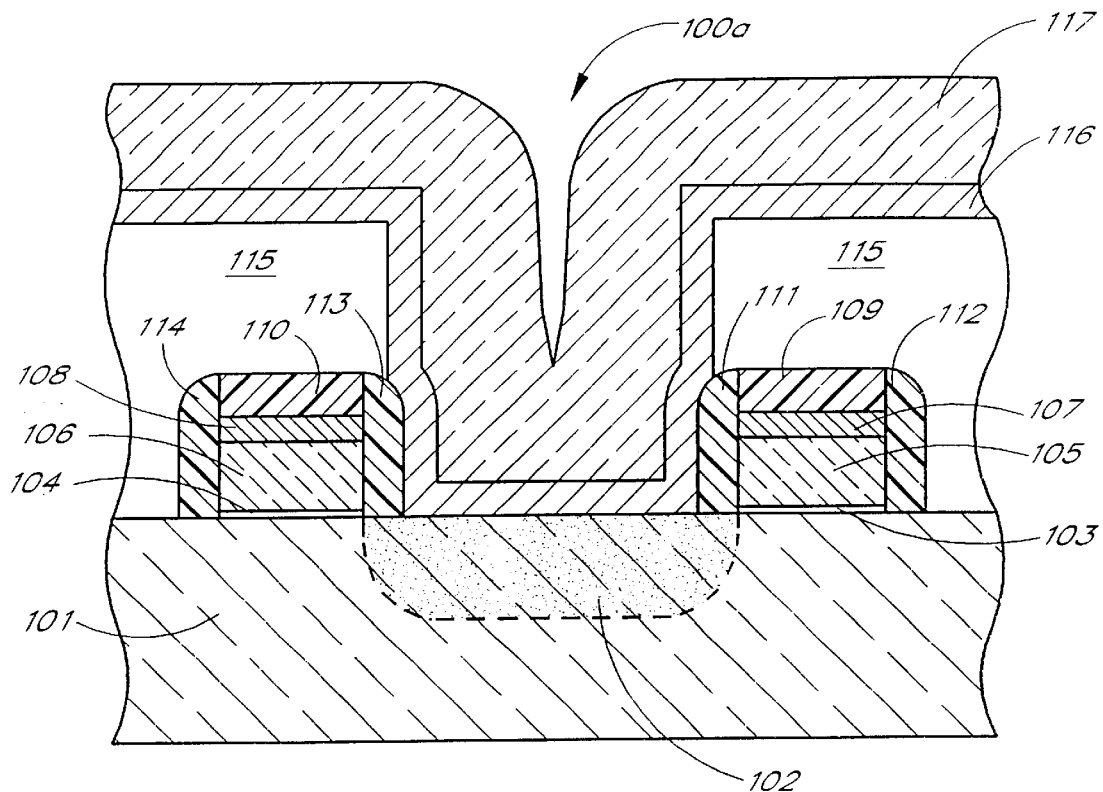
FIGS. 1A and 1B are partial schematic sectional views of an integrated circuit, illustrating a double-sided salicidation.

Supplemental silicon can also be introduced over a metallic layer to provide silicon required to form silicide. FIG. 1A, for example, illustrates a schematic sectional view of such a structure 100a formed on a silicon substrate 101. A highly doped silicon active area 102 is defined below a substrate surface 101'. In the illustrated embodiment, the active area 102, which may comprise a transistor source or drain, has an ultrashallow junction of no more than about 1,000 Å.

Two structures, such as gate structures in MOS devices, lie over silicon substrate 101 adjacent the active area 102. Each of the gate structures has a thin gate oxide layer 103, 104, a polysilicon gate electrode layer 105, 106, a metallic layer 107, 108, and a protective cap layer 109, 110. Sidewall spacers 111, 112, 113, 114 protect the gate stacks, and an insulating layer 115 (e.g., BPSG) covers the gate structures and the silicon substrate 101. A window is opened onto the active area 102 through the insulating layer 115 in order to provide contact to the active area 102. The contact window thus is defined by the insulating layer 115, inner sidewall spacers 111, 113, and the active area 102. A titanium layer 116 and a polysilicon layer 117 are deposited, in that order, into the contact window and over the insulating layer 115. The deposition of polysilicon over titanium forms a sandwich-like structure inside the window, in which the metal layer 116 is interposed between the supplemental silicon (i.e., the polysilicon layer 117) and the active area 102 of the silicon substrate 101. This structure 100a allows titanium in the titanium layer 116 to diffuse into and consume silicon from both the underlying active area 102 and the overlying polysilicon layer 117 when it is annealed. This process can be referred to as "double-sided salicidation."

Figure 1B:
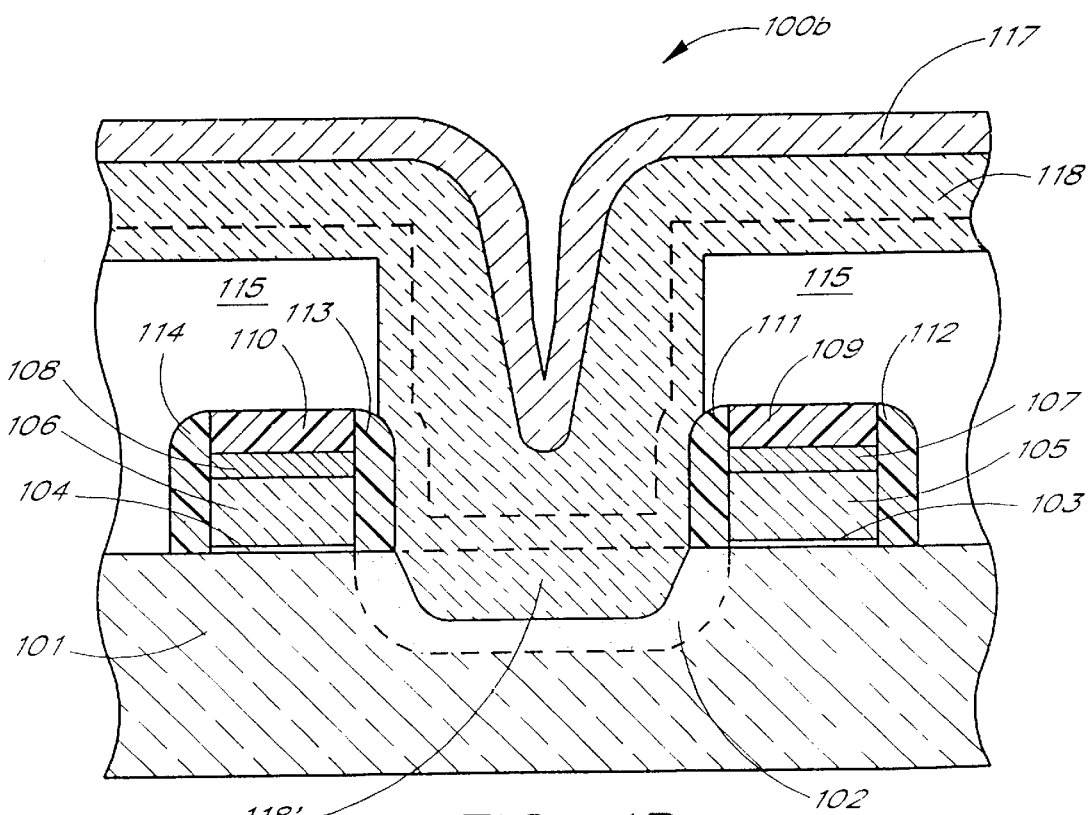

FIG. 1B, for example, shows a structure 100b which is the result of annealing the structure 100a of FIG. 1A. Over the insulating layer 115, only the overlying polysilicon 117 provides silicon for the reaction. Inside the contact window, on the other hand, the reaction proceeds in both directions. Titanium consumes silicon from both the overlying polysilicon layer 117 and the underlying active area 102 to form a silicon-rich titanium silicide 118' thick enough to present a low sheet resistance. While the titanium may diffuse at about a 10% higher rate in polysilicon than in monocrystalline silicon, the salicidation reaction is substantially symmetrical, consuming about the same amount of silicon from the substrate as from the overlying silicon 117.

While the double-sided salicidation reaction described above is preferable to conventional salicide, double-sided salicide is not without its problems. For example, chemical vapor deposition ("CVD"), the most common process for depositing polysilicon, does not easily form silicon over metallic layers, such as the titanium layer 116. This is due to the fact that the silicon does not easily nucleate on metal surfaces. Even if a silicon layer of suitable thickness can be formed over the titanium layer 116, double-sided salicidation may still consume too much of the silicon substrate 101, or result in too thin a silicide to provide a low enough sheet resistance.

Figure 2A:
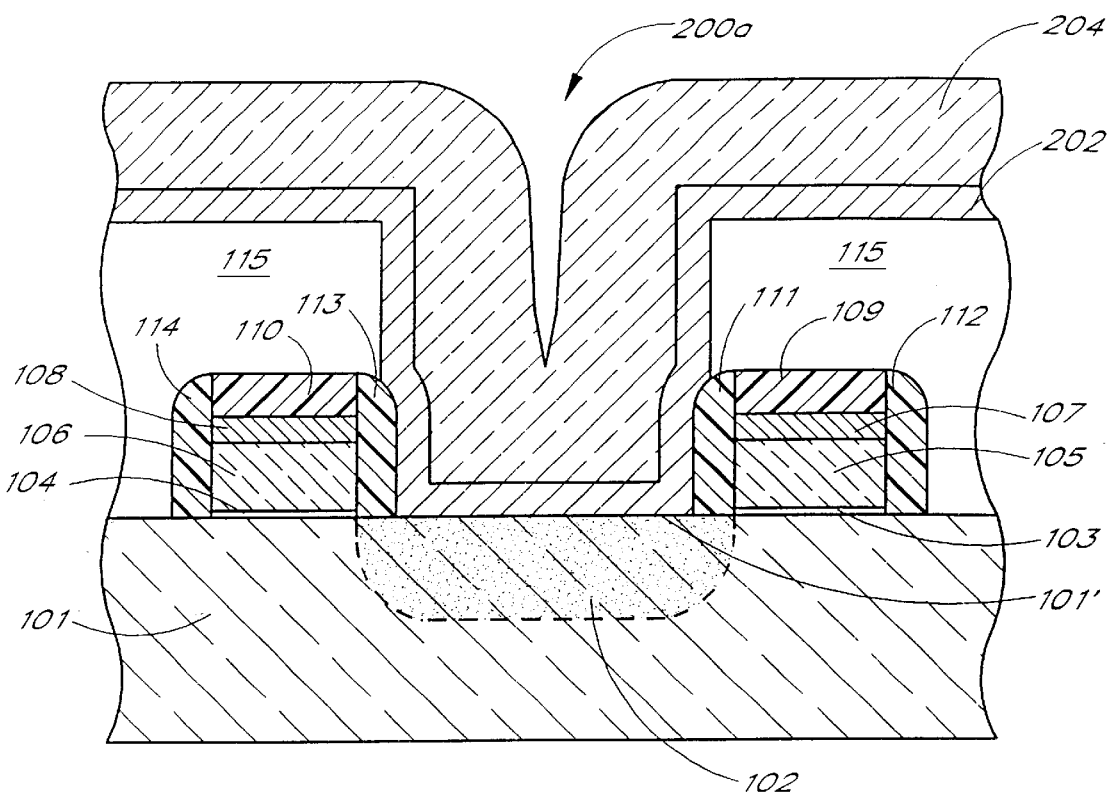
FIGS. 2A and 2B are partial schematic sectional views of an integrated circuit, illustrating self-aligned salicidation in accordance with a preferred embodiment of the present invention.

FIG. 2 depicts schematic sectional views of a silicon substrate assembly structure in accordance with a preferred embodiment of the present invention. Referring to FIG. 2A, an intermediate structure 200a is illustrated, in which a contact window is opened through an insulating layer 115 to expose an active area 102 of a silicon substrate 101. As the gates structures and insulating layer can be similar to those of FIG. 1A, like reference numerals will be used to refer to like parts.

A metal source layer 202, having an impurity therein, is deposited over the insulating layer 115 and the active area 102 through the contact window. Preferably, the impurity comprises nitrogen, and the metal source layer 202 comprises a metalrich nitride. Most preferably, the metal source layer 202 comprises titanium-rich titanium nitride of the form $TiN_x$ (x<1). Preferably x is between about 0.2 and 0.8, and most preferably between about 0.5 and 0.6. Methods of forming the preferred $TiN_x$ layer 202 will be discussed in greater detail below. The metal layer 202 is preferably between about 50 Å and 800 Å, more preferably between about 300 Å and 400 Å. While the layer 202 is not pure metal, it may be referred to as a metal layer for convenience.

A silicon source layer 204 is deposited over the metal source layer 202. As a result, the $TiN_x$ layer 202 is interposed between the active area 102 of the silicon substrate 101 and the silicon source layer 204, forming a sandwich structure. The silicon source layer 204, which may comprise amorphous or polycrystalline silicon, is preferably between about 100 Å and 10,000 Å, more preferably about 1,000 Å. While in other arrangements the silicon source layer need not be purely silicon, the preferred layer 204 simply consists of polysilicon.

After forming the silicon layer 204 over the metal source layer 202, the silicon 204 is preferably patterned, by conventional photolithography and silicon etch, in accordance with circuit design for the interconnect layer. Silicon 204 is thus left over the metal source layer 202 only where silicide interconnect is desired.

The structure 200a is then subjected to an anneal, preferably at between about 500° C. and 850° C., and more preferably between about 650° C. and 750° C., in a nitrogen ambient. During the annealing, metal and impurity atoms in the metal source layer 202 diffuse into the underlying active area 102 of the silicon substrate 101 and the overlying silicon layer 204. Likewise, silicon diffuses into the metal source layer 202 from the underlying active area 102 and the overlying silicon layer 204. Elementary titanium reacts with silicon from both sides and forms a titanium silicide, such that the process is a double-sided salicidation.

Figure 2B:
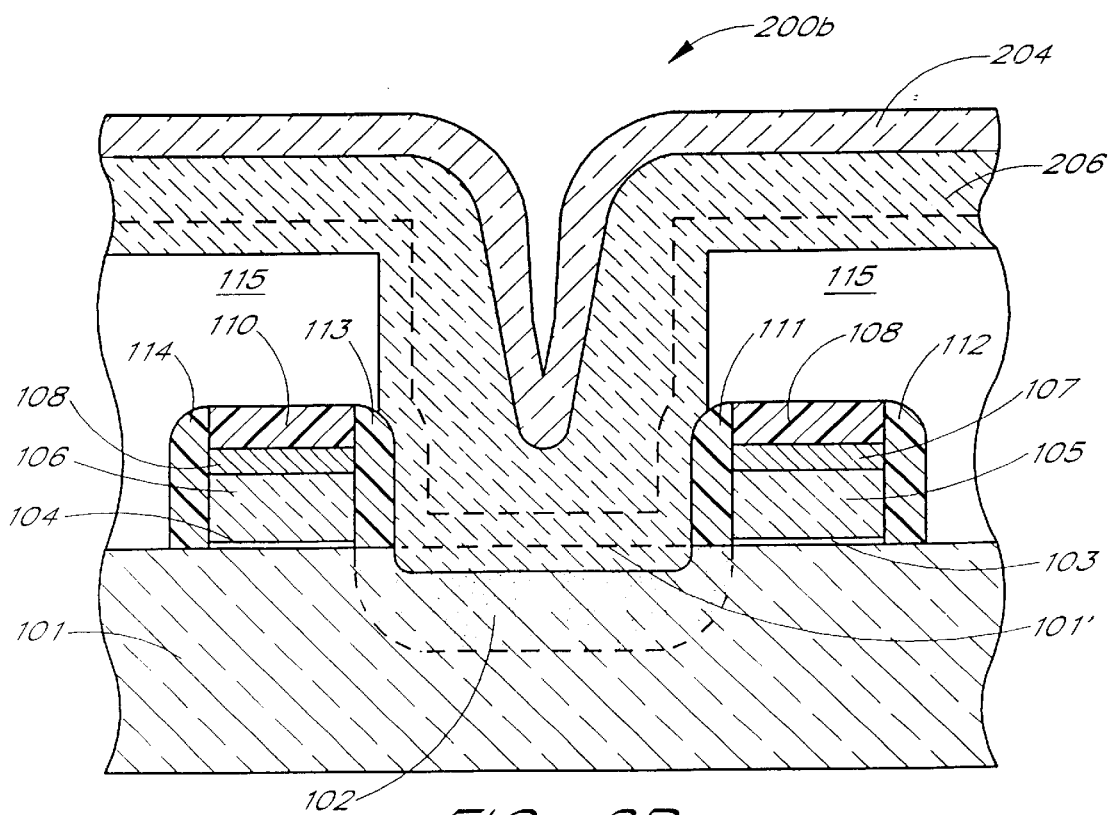

FIG. 2B shows a structure 200b which is formed by annealing the structure 200a of FIG. 2A. A silicide 206 is formed, comprising titanium nitride and titanium silicide. The resulting salicide layer 206 has sufficient thickness to provide low sheet resistance, preferably less than about 200 $\mu\Omega$.cm. The titanium silicide layer 206 preferably has a thickness greater than about 200 Å, more preferably greater than about 300 Å, and most preferably greater than about 500 Å.

After silicide formation, unreacted metal can be removed in a selective metal wet etch, as will be reorganized by one of ordinary skill in the art. Thus, where silicon had been removed in the pre-silicidation patterning, described above, unreacted metal can be washed away.

Significantly, the salicidation does not consume the same amount of silicon from the underlying active area 102 and the overlying silicon layer 204. The consumption of the underlying silicon area 102 is less than that of the overlying silicon layer 204. In particular, salicidation of the preferred $TiN_x$ layer 202 preferentially consumes overlying silicon relative to underlying silicon in a ratio of greater than about 1.2:1, more preferably greater than 2:1, and most preferably about 3:1. The salicidation occurs asymmetrically and thus does not destroy a shallow junction formed within the silicon substrate 101. Accordingly, the portion of the self-aligned silicide 206 sinking below the surface of the substrate 102 represents less than about 30% of the total silicide thickness within the contact, preferably less than about 20%.

Preferably, the silicide 206 extends or intrudes below the original surface 101' of the active area 102 by less than about 30% of the ultrashallow junction depth (e.g., less than about 300 Å of a 1,000 Å junction is consumed), more preferably less than about 25%, such that the transistor remains operable. It will be understood that, in other arrangements, the substrate surface from which the contact intrusion is measured can be that of a raised source/drain surface, and need not be coincident with the surface of a single crystal silicon wafer as shown.

It has been found that maximizing the bulk resistivity of the metal source layer 202 maximizes the asymmetry of silicide growth from the structure 200a of FIG. 2A. In turn, the salicide method discussed above results in the maximum silicide thickness for a given amount of substrate consumption.

The metal source layer 202 can be formed by any of a number of techniques. For example, a metal layer can be doped with impurities after deposition, by diffusion or implantation techniques. Preferably, however, the metal source layer 202 is formed incorporating impurities during formation and most preferably during sputtering, although one of skill in the art can apply CVD methods in light of the present disclosure.

Figure 3:
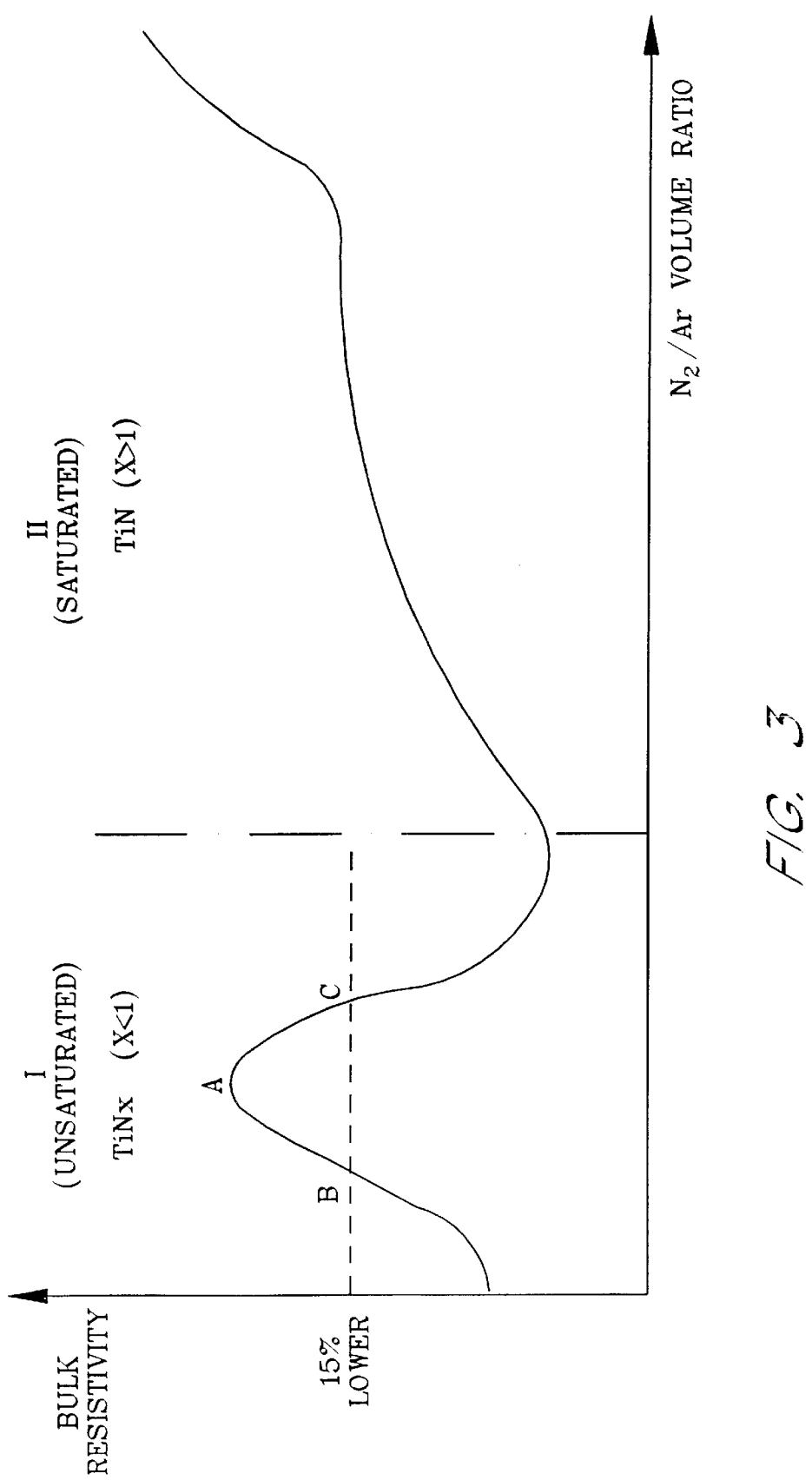
FIG. 3 shows the bulk resistivity of a titanium nitride layer as a function of $N_2$/Ar volume ratio in a reactive sputtering of Ti to form $TiN_x$ at a given target power.

FIG. 3 relates to a preferred method for choosing an optimal region for sputtering of Ti in a $N_2$ and Ar ambient, thereby forming a $TiN_x$ layer. Bulk resistivity of a titanium nitride layer is plotted as a function of $N_2$/Ar volume ratio in the reactive sputtering of Ti to form $TiN_x$ at a given target power. As FIG. 3 illustrates, reactive sputtering of Ti falls into two main regions or realms. Sputtering with $N_2$/Ar ratio within Region I results in an unsaturated or titanium-rich titanium nitride of the form, $TiN_x$ (x<1), while sputtering within Region II results in a saturated or standard TiN. Point A thus represents the flow ratio for which the highest bulk resistivity titanium-rich $TiN_x$ is achieved, which, in turn, reflects a highly uniform distribution of nitride nuclei throughout Ti film. Beyond this point, nuclei begin to grow and eventually contact one another, causing bulk resistivity to drop. Then the saturated region or Region II begins, wherein no titanium is available for salicidation. Resistivity again rises within this region as excess nitrogen interferes with conductivity. Points B and C represent lower and higher flow ratios, respectively, which result in a $TiN_x$ film of about 15% lower bulk resistivity than a film formed at peak A. This range of ratios represents a preferred processing window.

Absolute ratios in FIG. 3 depend upon the sputtering power. For example, with 2.0 kW sputtering power, 35 sccm of Ar and 7–8 sccm of $N_2$ result in a maximum Region I resistivity of about 270 $\mu\Omega$-cm. The $TiN_x$ resulting from this $N_2$/Ar ratio has x approximately equal to 0.6. Increasing sputtering power gives smaller $TiN_x$ nucleates, and reducing power gives larger $TiN_x$ nucleates. Higher sputtering power thus flattens out the peak A. It will be understood, in light of the present disclosure, that at higher sputter power, a larger window of preferred $N_2$/Ar ratios is available. In general, sputtering with a ratio closer to point A results in a better the $TiN_x$ distribution uniformity, which in turn results in greater salicide thickness uniformity after silicidation. Typically, x is around 0.5 or 0.6 at point A. It can be 0.2 to 0.8 between point B to point C when higher or lower sputtering power is used.

FIGS. 4A to 4D illustrate X-ray photoelectron spectroscopic profiles of integrated circuits of the present invention, illustrating the consumption of silicon from the active area 102 of the silicon substrate 101 and the overlying silicon layer 204. Wafers of silicon assembly structures having 1,000 Å α-Si/400 Å TiN$_x$/Si substrate and 1,000 Å α-Si/300 Å TiN$_x$/Si substrate were subjected to rapid thermal processing ("RTP") at different temperatures. The metal source layers 202 of the wafers were deposited by reactively sputtering a titanium target at the N$_2$/Ar ratio of point A, as described above. X-ray photoelectron spectroscopic ("XPS") profiles for 1000 Å α-Si/400 Å TiN$_x$/Si substrate structures are shown.

Figure 4A:
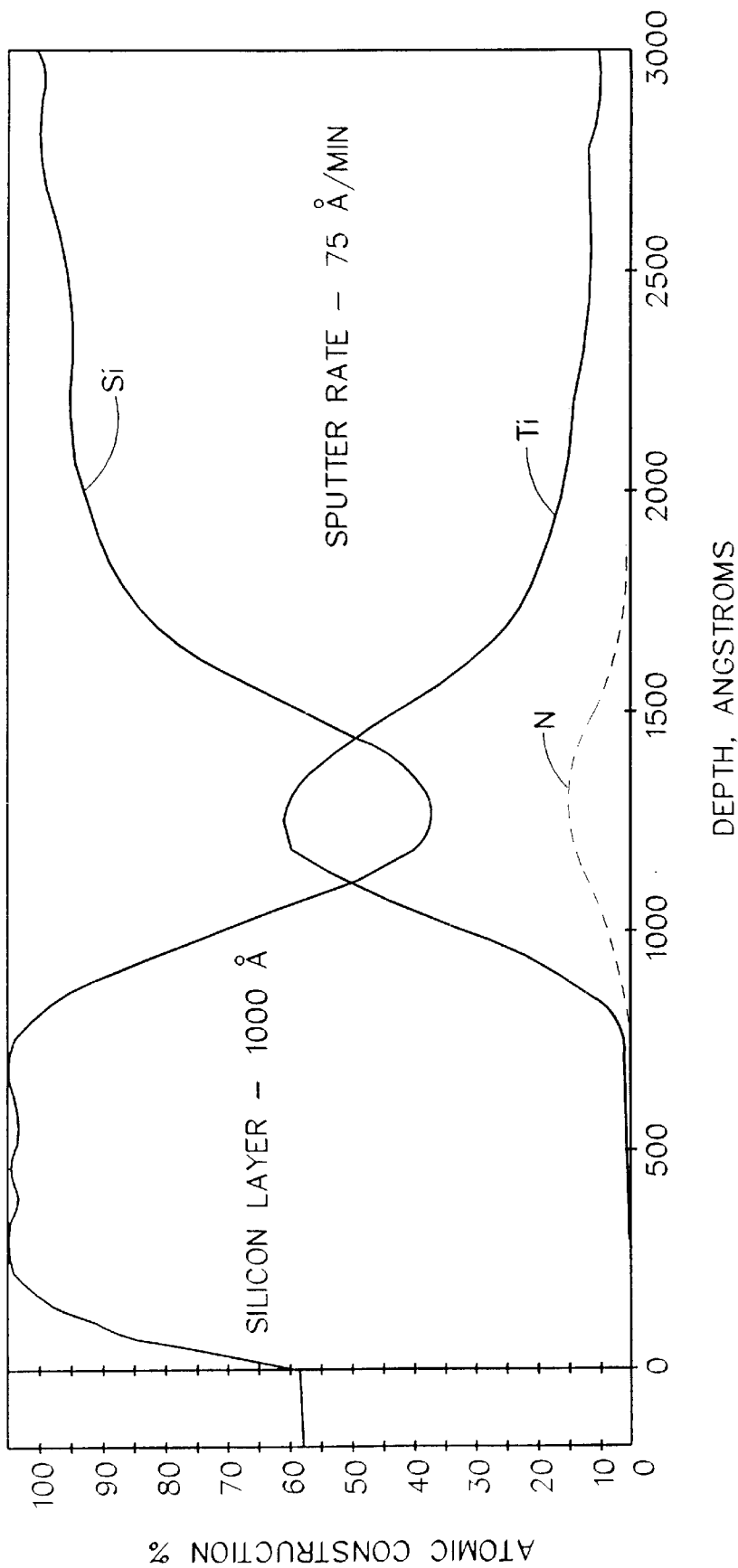
FIG. 4A is a profile of an integrated circuit prior to annealing.

FIG. 4A is a profile of the sandwich structure prior to annealing. At the center of FIG. 2A, titanium and nitrogen atoms forming the preferred metal source layer 202 are shown between silicon-rich areas. Trace elements are omitted.

Figure 4B:
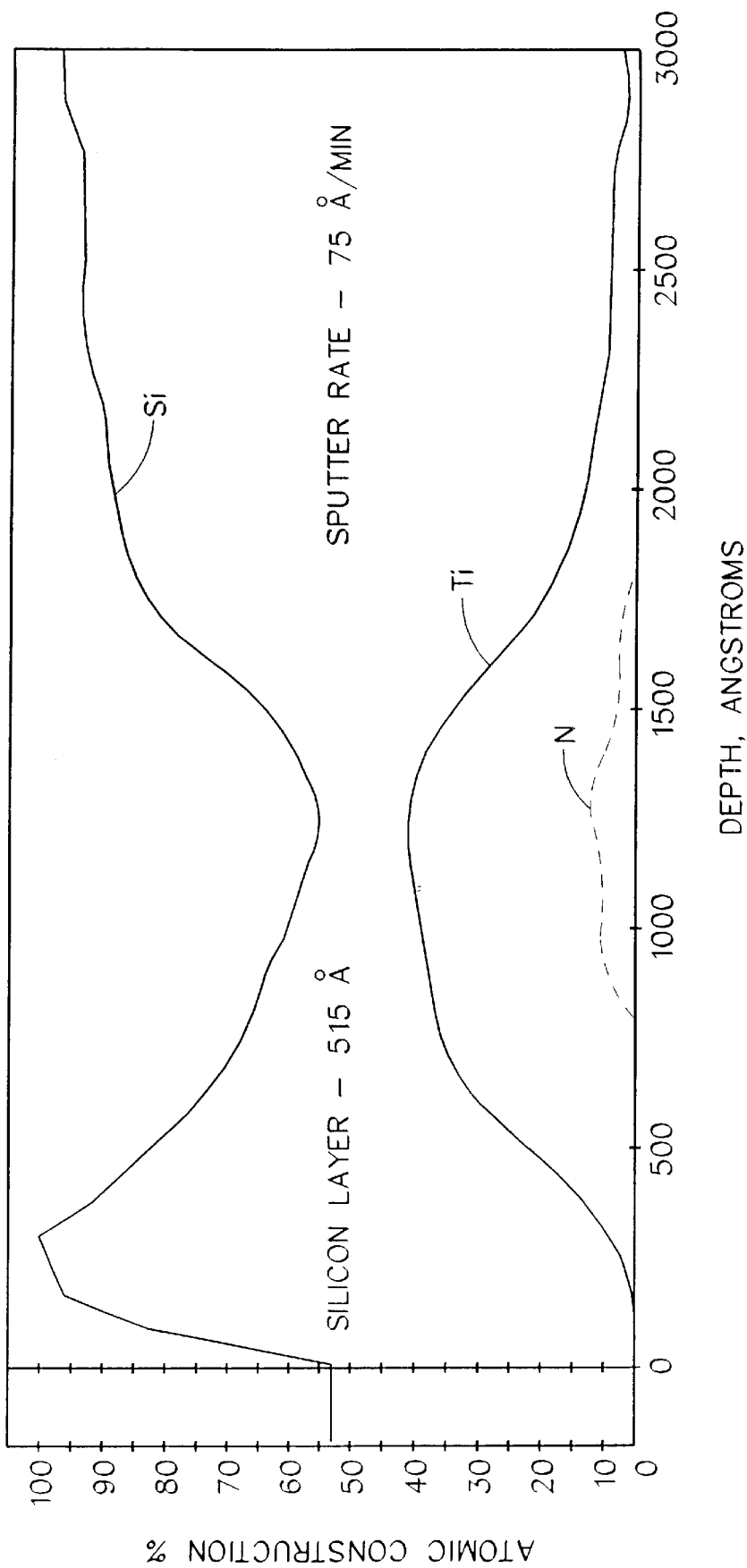
FIGS. 4B, 4C, and 4D are profiles of integrated circuits annealed at different temperatures.
Figure 4C:
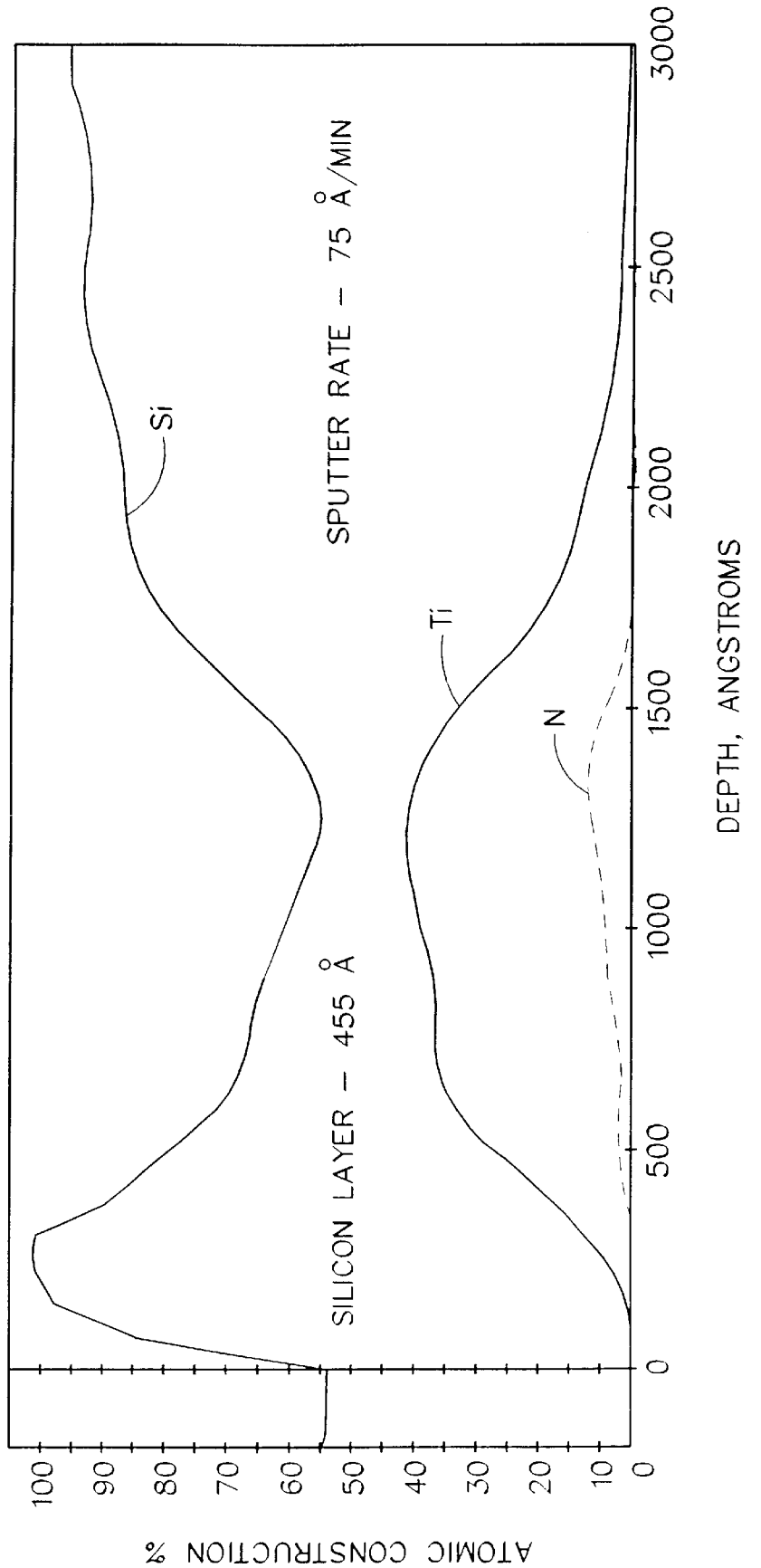
Figure 4D:
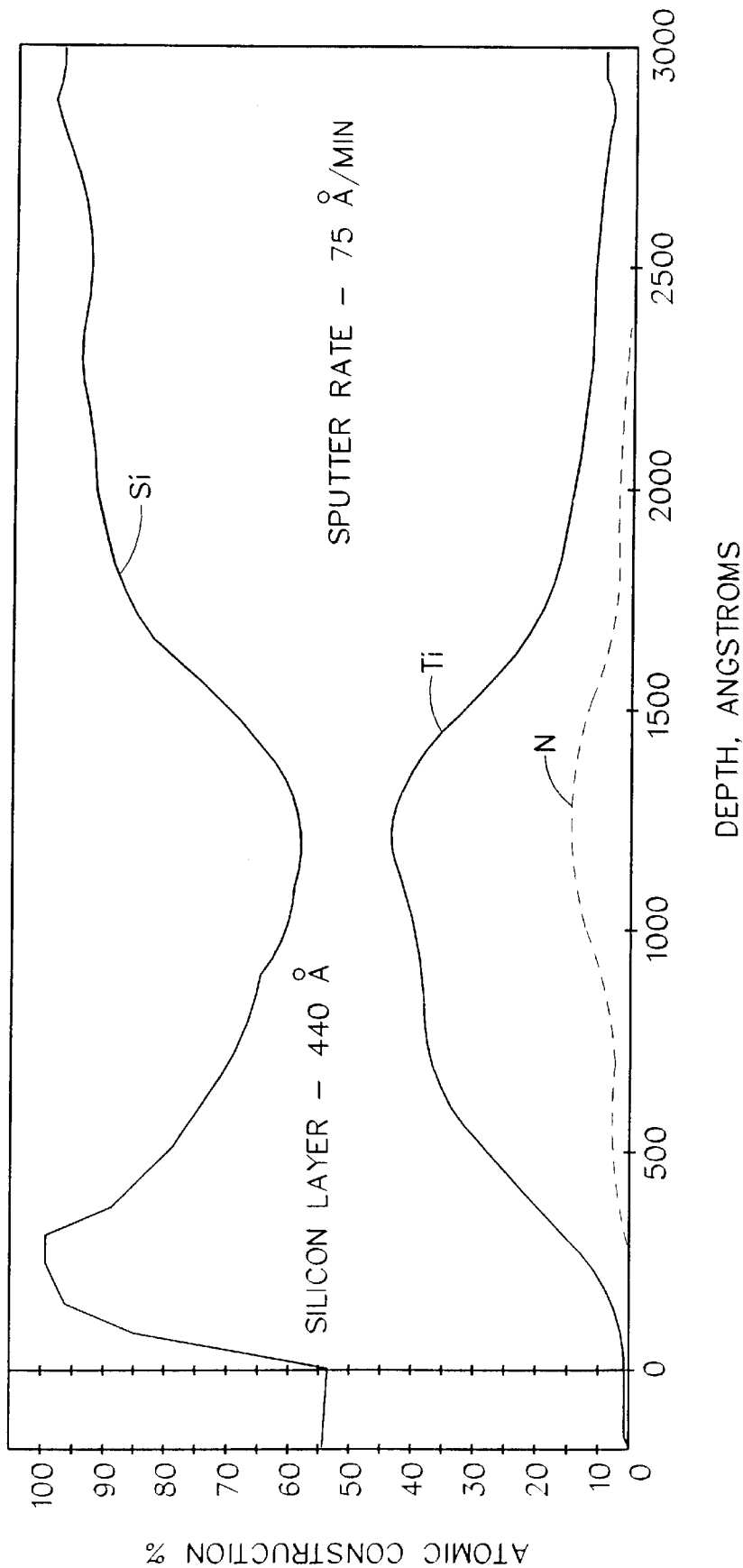

FIG. 4B is a profile for the structure annealed at 675° C. for 10 seconds. About 515 Å of silicon remains after the RTP. FIG. 4C and 4D are profiles of similar structures annealed at 710° C. and 790° C., respectively, for 20 seconds each. As can be seen in the FIGS. 4B to 4D, titanium is found asymmetrically toward the left of the profile (representing points above the substrate) after the anneal. Total atomic percentage analysis results reveal asymmetric characteristic of double-sided salicide formation at temperatures from 675° C. to 790° C. Clearly, salicide formation consumes more of the silicon source layer (α-Si or poly-Si) deposited over the metal source layer than silicon substrate below the metal source layer. The titanium salicide profiles remain stable between 675° C. and 790° C. The profiles of a sandwich structure using 300 Å of TiN$_x$ as the metal source layer are similar to the profiles shown in FIGS. 4A to 4D, except that they consume even less (about 20% less) of the silicon substrate.

Figure 5:
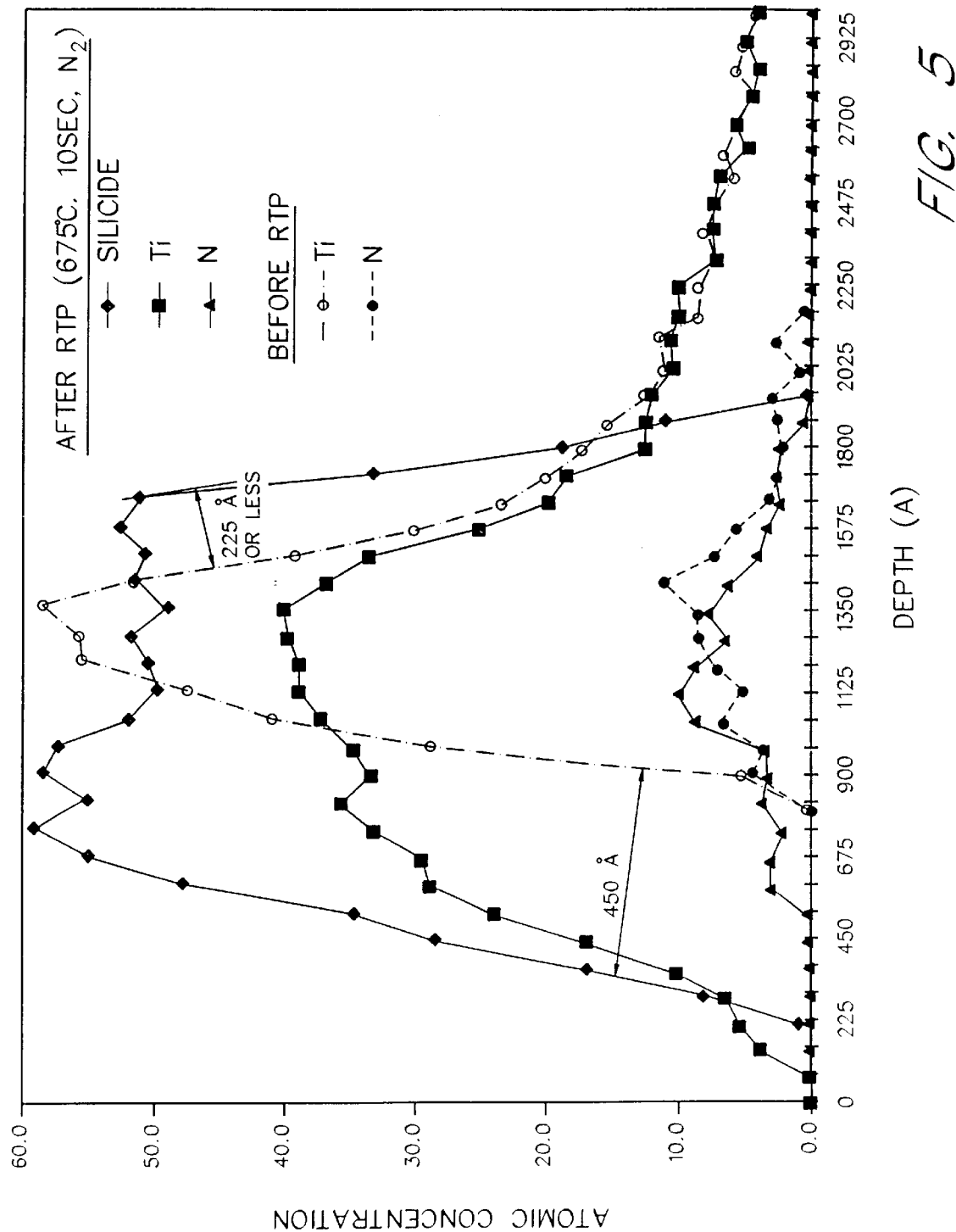
FIG. 5 shows XPS curve-fitting results of FIGS. 4A and 4B.

FIG. 5 shows curve-fitting results of the X-ray photoelectron spectroscopy profiles of FIGS. 4A and 4B to quantitatively analyze the degree of asymmetry of the preferred double-sided salicidation. As can be seen, the salicidation of titanium consumes the overlying silicon layer 204 at least twice as much as it consumes the silicon substrate 101. A comparison of the titanium profile prior to anneal with the silicide profile after anneal shows consumption of less than 225 Å of the silicon substrate 101 (represented by a shift to the right), whereas about 450 Å of the overlying silicon layer 204 (represented by a shift to the left) is consumed. For the process using 300 Å of TiN$_x$, not shown, consumption of the substrate is down to 180 Å. This low consumption (representing less than 25% and even less than 20% with use of 300 Å TiN$_x$ layer) is very important for ultrashallow junction applications. For 750–1,000 Å junctions, the source/drain contact should preferably consume less than about 300 Å, more preferably less than about 250 Å, of silicon substrate to reduce leakage. At the same time, the salicide total thickness is preferably at least about 300 Å, more preferably at least about 500 Å, to form sufficiently low contact resistance, thermally and dynamically stable in the face of post-silicidation anneal (converting the grain to C54 orientation) and other high temperature processes.

As also apparent from FIGS. 4 and 5, the resultant metal silicide contact contains the impurity which was incorporated into the metal source layer. In particular, nitrogen is present in the titanium silicide layer, preferably comprising between about 5% and 80% of the silicide layer 206 (FIG. 2B), more preferably comprising about 10% to 30%, and most preferably in the range of about 15% to 20%. The XPS profiles of FIG. 4 indicate a slightly lower percentage of nitrogen than actual, due to preferential readings by the measuring apparatus.

Figure 6A:
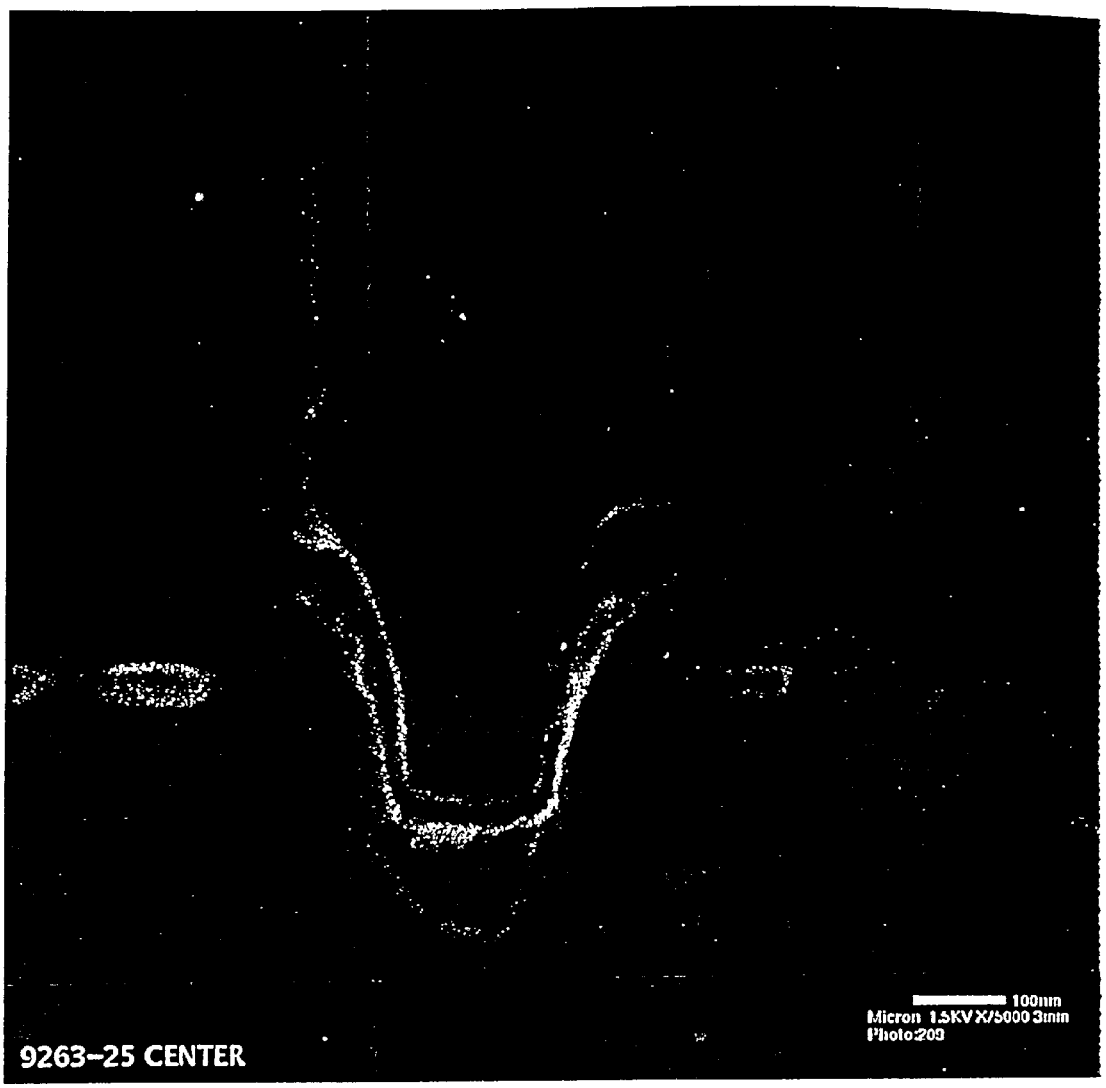
FIG. 6A shows a bit-line contact X-SEM result on an actual device which was run though furnace reflow.
Figure 6B:
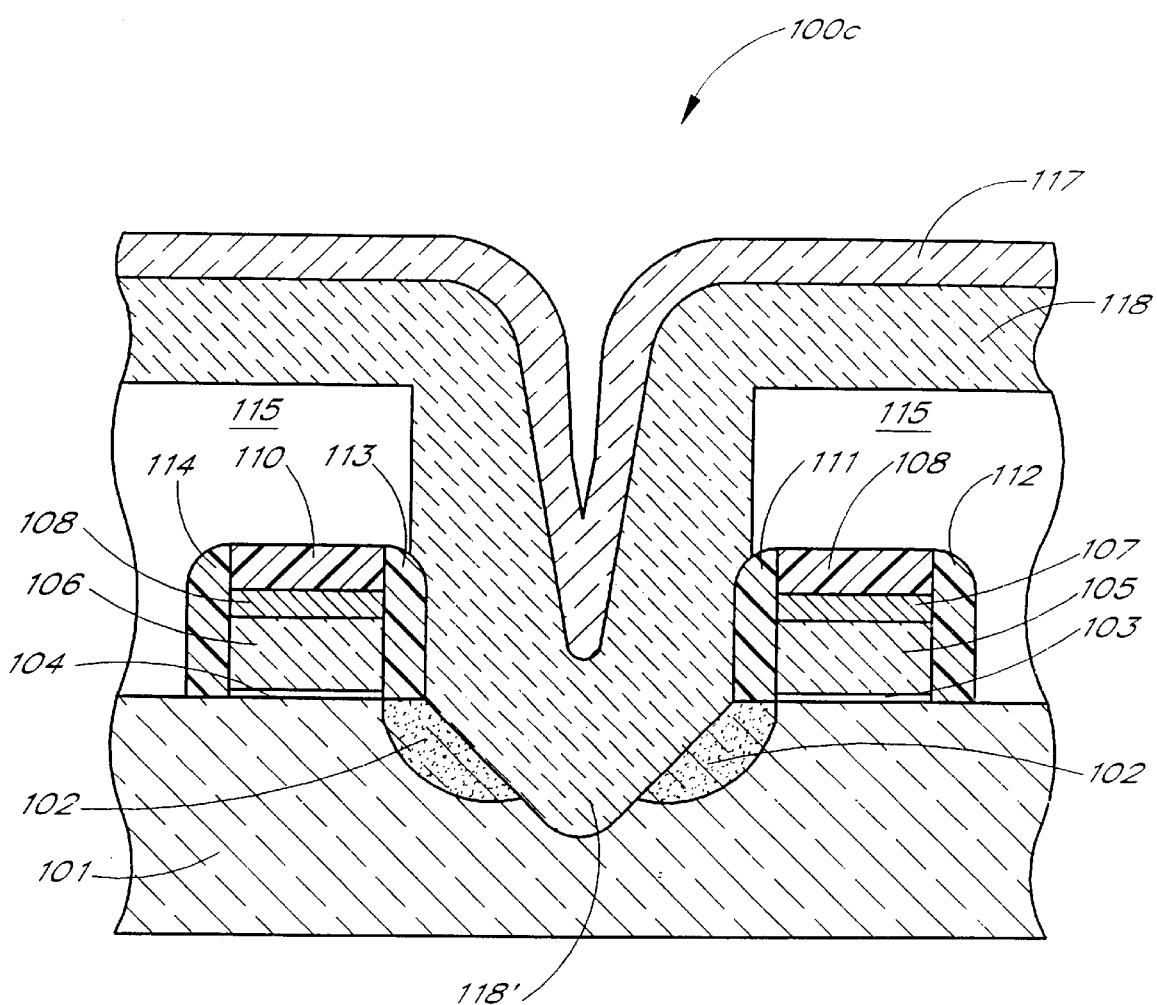
FIG. 6B is a schematic sectional view of the integrated circuit of FIG. 1B after furnace reflow.

Referring to FIGS. 6A and 6B, a conventionally-formed self-aligned silicide contact is shown after a high temperature glass reflow, typically conducted at about 750° C. for about 10 minutes. FIG. 6A shows an X-SEM of an actual device after furnace reflow, where the contact was formal by sintering a sandwich structure with 300 Å pure titanium between a silicon substrate and a 1,000 Å polysilicon layer. The wafer was run through the entire device fabrication process flow, including furnace reflow at 750° C., after forming the salicide contact. As can be seen in FIG. 6A, a silicide crater can be found after reflow at 750° C. The crater is more than 1,000 Å deep, such that an ultrashallow junction would be destroyed. FIG. 6B schematically illustrates the structural deformation. The structure 100b of FIG. 1B is shown after furnace reflow. The structure 100c of FIG. 6B shows that a part of silicide 118' extends even further into the active area 102 after reflow.

In contrast, actual devices were constructed in accordance with the preferred embodiment, and put through furnace reflow at different temperatures. X-SEM results showed no such crater on wafers processed with either 300 Å TiN$_x$ or 400 Å TiN$_x$ layers. The TiSi$_x$/Si interface remained smooth and intact. The crater in salicide contacts formed conventionally is believed to be associated with tendency of TiSi$_x$, large grain formation to reduce surface energy and effect of agglomeration at high temperature. Formation of excessively large grains is drastically suppressed by the preferred embodiments, however, by incorporating TiN$_x$ nuclei into TiSi$_x$ film.

The intermediate assembly structure having a TiN$_x$ (x<1) layer and a silicon layer (see FIG. 2A) over the silicon substrate enables asymmetric salicidation (FIG. 2B). The asymmetric salicidation enables self-aligned formation of silicides thick enough to provide low contact resistance, while consuming less than about 300 Å, more preferably less than 250 Å, of the silicon substrate. The process preferably consumes greater than 1.2, more preferably greater than 2 times more silicon from the overlying silicon layer than from silicon substrate. This asymmetric salicidation facilitates self-aligned contact metallization for an ultrashallow junction (<1,000 Å), consuming less than 30% and preferably less than about 20% of the junction while providing adequately low resistivity contacts. This unique titanium silicide contact also has a much higher thermal stability than conventionally-formed self-aligned silicide.

Although the foregoing invention has been described in terms of certain preferred embodiments, other embodiments will become apparent to those of ordinary skill in the art, in view of the disclosure herein. Accordingly, the present invention is not intended to be limited by the recitation of preferred embodiments, but is instead intended to be defined solely by reference to the appended claims.

I claim:

1. A method for forming a self-aligned silicide contact on a silicon substrate, the method comprising:
   forming a contact window through an insulating layer formed over the silicon substrate, thereby exposing a portion of the silicon substrate;
   depositing a metal nitride layer directly over the exposed portion of the silicon substrate;
   forming a silicon layer over the metal nitride layer; and thereafter
   annealing the substrate to form the metal silicide contact in the contact window.

2. The method as defined in claim 1, wherein the insulating layer is formed over circuit elements fabricated over the silicon substrate.

3. A method for forming a self-aligned silicide contact on a silicon substrate, the method comprising:
   forming a contact window through an insulating layer formed over the silicon substrate, thereby exposing a portion of the silicon substrate;
   depositing a metal nitride layer directly the exposed portion of the silicon substrate;
   forming a silicon layer over the metal nitride layer; and
   annealing the substrate to form the metal silicide contact in the contact window, wherein the metal silicide is formed in the annealing step by consuming silicon from both the underlying exposed portion of the silicon substrate and the overlying silicon layer.

4. The method as defined in claim 3, wherein less of the underlying silicon substrate is consumed than the overlying silicon layer.

5. The method as defined in claim 4, wherein the silicide contact has a sheet resistance of less than about 200 $\mu\Omega$.cm.

6. The method as defined in claim 1, wherein the metal nitride layer comprises a metal-rich metal nitride.

7. The method as defined in claim 1, wherein the metal nitride layer comprises titanium.

8. The method as defined in claim 7, wherein the metal nitride layer is titanium-rich, having the form $TiN_x$.

9. The method as defined in claim 8, wherein x is in the range of 0.2 to 0.8.

10. The method as defined in claim 9, wherein x is in the range of 0.5 to 0.6.

11. The method as defined in claim 1, wherein depositing the metal nitride layer comprises sputtering a metallic target in a nitrogen and noble gas ambient.

12. The method as defined in claim 11, wherein the ratio of nitrogen to noble gas is selected to maximize bulk resistivity of the metal nitride layer within a metal-rich class of metal nitrides.

13. The method as defined in claim 12, wherein the ratio is selected from a window of ratios producing bulk resistivities within 15% of the maximum bulk resistivity for the metal-rich class of metal nitrides.

14. The method as defined in claim 1, further comprising patterning the silicon layer prior to annealing the substrate.

15. A method for forming a metal source layer between silicon structures in an integrated circuit, the metal source layer incorporating a uniform distribution of an impurity and a metal, the method comprising:
   selecting a sputtering ambient to maximize bulk resistivity for a metal-rich class of layers incorporating the impurity and the metal; and
   sputtering a metallic target in the selected ambient.

16. The method as defined in claim 15, wherein selecting the sputtering ambient comprises:
   forming a plurality of test metal source layers, the test metal layers formed by sputtering a plurality of targets of the same type under the same sputtering power in a plurality of test sputtering ambients, each of the test sputtering ambients having a different ratio of impurity to noble gas; and
   measuring the bulk resistivity of each of the test metal layers.

17. The method as defined in claim 16, wherein selecting the sputtering ambient comprises selecting a ratio of impurity to noble gas to produce the metal source layer with a bulk resistivity within about 15% of a maximum bulk resistivity among the test metal source layers.

18. The method as defined in claim 15, wherein the impurity comprises nitrogen.

19. The method as defined in claim 15, wherein the metal is titanium.

20. The method as defined in claim 15, wherein the noble gas comprises argon.

21. A method of forming a silicide interconnect over a silicon substrate, the method comprising;
   selecting a metal layer incorporating an impurity to a level below saturation, the unsaturated metal layer having a bulk resistivity within about 15% of the maximal resistivity for unsaturated metal layers having the same metal and impurity;
   depositing the selected layer over the silicon substrate; and
   sintering the selected layer and the substrate.

22. The method of claim 21, wherein the metal comprises titanium, and the impurity comprises nitrogen.

23. The method of claim 22, further comprising depositing a silicon layer over the metal layer prior to sintering.

24. A method of forming a self-aligned silicide contact to a semiconductor substrate, the method comprising:
   opening a contact in an insulating layer to expose an active region of the substrate;
   depositing a refractory metal source layer into the contact directly over the active region of the substrate;
   depositing a silicon source layer directly over the refractory metal source layer; and
   performing a silicidation to form the self-aligned silicide contact, the silicidation preferentially consuming silicon from the silicon source layer as compared to silicon from the substrate in a ratio of greater than about 1.2:1.

25. The method of claim 24, wherein the silicidation preferentially consumes silicon from the silicon source layer compared to silicon from the substrate in a ratio of greater than about 2:1.

26. The method of claim 25, wherein the silicidation preferentially consumes silicon from the silicon source layer compared to silicon from the substrate in a ratio of greater than about 3:1.

27. A method for forming a self-aligned silicide contact on a silicon substrate, the method comprising:
   forming an insulating layer covering a circuit element formed over the silicon substrate;
   forming a contact window through the insulating layer, thereby exposing a portion of the silicon substrate;
   depositing a metal nitride layer directly over the exposed portion of the silicon substrate; and
   forming a silicon layer over the metal nitride layer.

28. The method of claim 27, further comprising annealing the substrate to form the metal silicide contact in the contact window.

29. The method of claim 28, further comprising performing a silicidation to form the self-aligned silicide contact, the silicidation consuming silicon from the silicon source layer as well as the substrate.

* * * * *